United States Patent
Di Vincenzo et al.

(10) Patent No.: US 10,910,054 B2
(45) Date of Patent: *Feb. 2, 2021

(54) CHARGE SEPARATION FOR MEMORY SENSING

(71) Applicant: Micron Technology, Inc., Boise, ID (US)

(72) Inventors: Umberto Di Vincenzo, Capriate San Gervasio (IT); Riccardo Muzzetto, Arcore (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,683

(22) Filed: Sep. 3, 2019

(65) Prior Publication Data

US 2020/0005868 A1    Jan. 2, 2020

Related U.S. Application Data

(63) Continuation of application No. 15/846,373, filed on Dec. 19, 2017, now Pat. No. 10,446,232.

(51) Int. Cl.
*G11C 11/22* (2006.01)
*G11C 14/00* (2006.01)

(52) U.S. Cl.
CPC ........ *G11C 14/0027* (2013.01); *G11C 11/221* (2013.01); *G11C 11/2273* (2013.01); *G11C 11/2293* (2013.01)

(58) Field of Classification Search
CPC ............ G11C 14/0027; G11C 11/2293; G11C 11/221; G11C 11/2273
USPC .......................................................... 365/145
See application file for complete search history.

(56) References Cited

U.S. PATENT DOCUMENTS

| | | |
|---|---|---|
| 6,459,609 B1 | 10/2002 | Du |
| 6,741,490 B2 | 5/2004 | Baker |
| 9,224,466 B1 | 12/2015 | Chen et al. |
| 10,446,232 B2* | 10/2019 | Di Vincenzo ......... G11C 11/221 |
| 2003/0053326 A1 | 3/2003 | Murakuki |
| 2003/0123294 A1 | 7/2003 | Kim et al. |
| 2004/0095823 A1* | 5/2004 | Tam ........................ G11C 11/22 365/205 |
| 2004/0257855 A1 | 12/2004 | Hilton |

(Continued)

OTHER PUBLICATIONS

Decision of Rejection from related Taiwanese patent application No. 107145395, dated Oct. 17, 2019, 8 pages.

(Continued)

*Primary Examiner* — Tha-O H Bui
(74) *Attorney, Agent, or Firm* — Brooks, Cameron & Huebsch, PLLC

(57) ABSTRACT

The present provision includes apparatuses, methods, and systems for charge separation for memory sensing. An embodiment includes applying a sensing voltage to a memory cell, and determining a data state of the memory cell based, at least in part, on a comparison of an amount of charge discharged by the memory cell while the sensing voltage is being applied to the memory cell before a particular reference time and an amount of charge discharged by the memory cell while the sensing voltage is being applied to the memory cell after the particular reference time.

18 Claims, 7 Drawing Sheets

(56) References Cited

U.S. PATENT DOCUMENTS

| | | | |
|---|---|---|---|
| 2007/0008781 A1* | 1/2007 | Jono | G11C 11/5628 |
| | | | 365/185.23 |
| 2009/0219757 A1* | 9/2009 | Furuta | G11C 7/02 |
| | | | 365/171 |
| 2010/0128513 A1 | 5/2010 | Nishimura | |
| 2014/0198559 A1 | 7/2014 | Perner | |
| 2017/0287541 A1 | 10/2017 | Vimercati | |

OTHER PUBLICATIONS

U.S. Appl. No. 15/669,290, entitled, "Wear Leveling", filed Aug. 4, 2017, 28 pages.
International Search Report and Written Opinion from related international application No. PCT/US2018/064239, dated Apr. 1, 2019, 15 pages.
Office Action from related Taiwanese patent application No. 107145395, dated Jul. 5, 2019, 8 pages.

\* cited by examiner

CHARGE SEPARATION FOR MEMORY SENSING

PRIORITY INFORMATION

This application is a Continuation of U.S. application Ser. No. 15/846,373 filed on Dec. 19, 2017, now U.S. Pat. No. 10,446,232, issued Oct. 15, 2019, the contents of which are incorporated herein by reference.

TECHNICAL FIELD

The present disclosure relates generally to semiconductor memory and methods, and more particularly, to charge separation for memory sensing.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), ferroelectric random-access memory (FeRAM), resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor). Such memory cells can be programmed to store data corresponding to a target data state by varying the charge level of the storage element (e.g., different levels of charge of the capacitor may represent different data sates). For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1A:
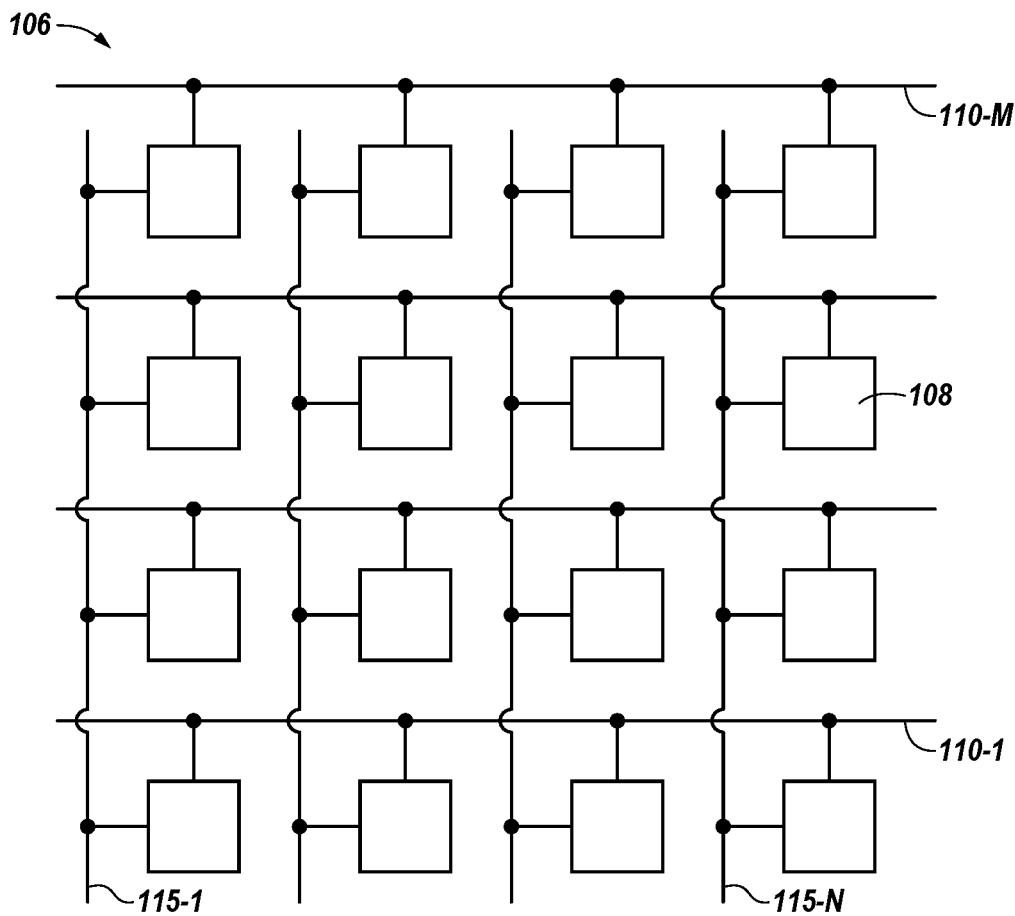
FIG. 1A illustrates an example of a memory array in accordance with an embodiment of the present disclosure.

The present disclosure includes apparatuses, methods, and systems for charge separation for memory sensing. An embodiment includes applying a sensing voltage to a memory cell, and determining a data state of the memory cell based, at least in part, on a comparison of an amount of charge discharged by the memory cell while the sensing voltage is being applied to the memory cell before a particular reference time and an amount of charge discharged by the memory cell while the sensing voltage is being applied to the memory cell after the particular reference time.

Sensing memory (e.g., FeRAM memory) using charge separation in accordance with the present disclosure can be faster, use less power, and/or be more reliable than previous approaches for sensing memory. For example, sensing memory using charge separation in accordance with the present disclosure can include and/or utilize a single pulse, self-reference sensing approach that can be faster, use less power, and/or be more reliable than previous sensing approaches that may require an external reference (e.g., an external reference voltage) and/or multiple (e.g., separate) sensing signals (e.g. pulses) in order to determine the state of a memory cell.

As used herein, "a" or "an" can refer to one or more of something, and "a plurality of" can refer to more than one of such things. For example, a memory cell can refer to one or more memory cells, and a plurality of memory cells can refer to two or more memory cells. Additionally, the designators "M" and "N" as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIGS. 1A and 1B, and a similar element may be referenced as 308 in FIG. 3.

FIG. 1A illustrates an example of a memory array 106 in accordance with an embodiment of the present disclosure. Memory array 106 can be, for example, a ferroelectric memory (e.g., FeRAM) array.

As shown in FIG. 1A, memory array 106 may include memory cells 108 that may be programmable to store different states. A memory cell 108 may include a capacitor to store a charge representative of the programmable states. For example, a charged and uncharged capacitor may respectively represent two logic states (e.g. 0 and 1). A memory cell 108 may include a capacitor with a ferroelectric material, such as, for instance, lead zirconate titanate (PZT), in some examples. For example, ferroelectric materials may have a non-linear relationship between an applied electric field and stored charge (e.g., in the form of a hysteresis loop), and may have a spontaneous electric polarization (e.g., a non-zero polarization in the absence of an electric field). Different levels of charge of a ferroelectric capacitor may represent different logic states, for example.

As shown in FIG. 1A, a memory cell 108 may be coupled to a respective access line, such as a respective one of access lines 110-1 to 110-M, and a respective data (e.g., digit) line, such as one of data lines 115-1 to 115-N. For example, a memory cell 108 may be coupled between an access line 110 and a data line 115. In an example, access lines 110 may also be referred to as word lines, and data lines 115 may also be referred to as bit lines. Access lines 110 and data lines 115, for example, may be made of conductive materials, such as copper, aluminum, gold, tungsten, etc., metal alloys, other conductive materials, or the like.

In an example, memory cells 108 commonly coupled to an access line 110 may be referred to as a row of memory cells. For example, access lines 110 may be coupled to a row decoder (not shown in FIG. 1A), and data lines 115 may be coupled to a column decoder (not shown in FIG. 1A). Operations such as programming (e.g., reading) and sensing (e.g., writing) may be performed on memory cells 108 by activating or selecting the appropriate access line 110 and a data line 115 (e.g., by applying a voltage to the access line). Activating an access line 110 may electrically couple the corresponding row of memory cells 108 to their respective data lines 115.

Although not shown in FIG. 1A for clarity and so as not to obscure embodiments of the present disclosure, memory array 106 can be included in an apparatus in the form of a memory device. As used herein, an "apparatus" can refer to, but is not limited to, any of a variety of structures or combinations of structures, such as a circuit or circuitry, a die or dice, a module or modules, a device or devices, or a system or systems, for example. Further, the apparatus (e.g., memory device) may include an additional memory array(s) analogous to array 106.

Figure 1B:
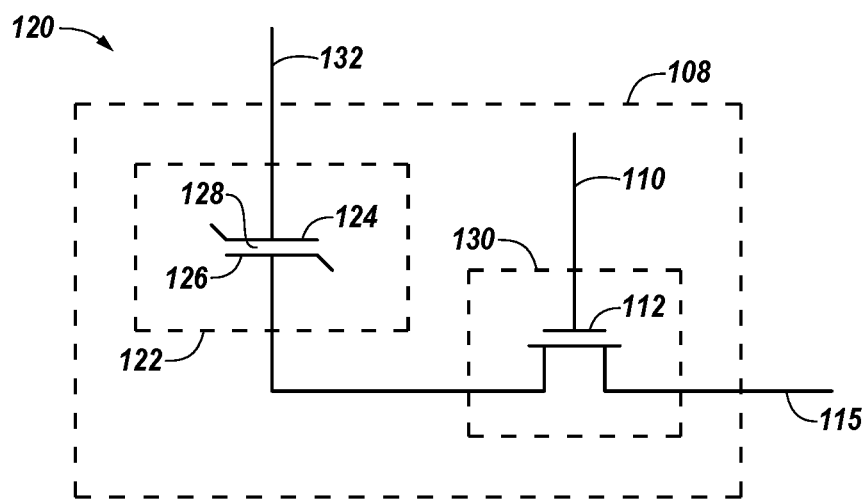
FIG. 1B illustrates an example of a memory cell in accordance with an embodiment of the present disclosure.

FIG. 1B illustrates an example circuit 120 that includes a memory cell 108 in accordance with an embodiment of the present disclosure. As shown in FIG. 1B, circuit 120 may include a ferroelectric memory (e.g., FeRAM) cell 108, an access line 110, and a data line 115 that may respectively be examples of a memory cell 108, an access line 110, and a data line 115, shown in FIG. 1A.

As shown in FIG. 1B, memory cell 108 may include a storage element, such as a capacitor 122, that may have a first plate, such as a cell plate 124, and a second plate, such as a cell bottom 126. Cell plate 124 and cell bottom 126 may be capacitively coupled through a ferroelectric material 128 positioned between them. The orientation of cell plate 124 and cell bottom 126 may be flipped without changing the operation of memory cell 108.

As shown in FIG. 1B, circuit 120 may include a select device 130, such as a select transistor. For example, the control gate 112 of select device 130 may be coupled to access line 110. In the example of FIG. 1B, cell plate 124 may be accessed via plate line 132, and cell bottom 126 may be accessed via data line 115. For example, select device 130 may be used to selectively couple data line 115 to cell bottom 126 in response to access line 110 activating select device 130. For example, capacitor 122 may be electrically isolated from data line 115 when select device 130 is deactivated, and capacitor 122 may be electrically coupled to data line 115 when select device 130 is activated. Activating select device 130 may be referred to as selecting memory cell 108, for example.

In an example, sources of an electric field or energy, such as positive or negative electrical pulses (e.g., positive or negative voltage or current pulses), can be applied to the storage element of memory cell 108 (e.g., to capacitor 122) for a particular duration to program the cell to a target data state. For instance, when the electric field (e.g., the electrical pulses) is applied across the ferroelectric material 128 of capacitor 122, the dipoles of ferroelectric material 128 may align in the direction of the applied electric field. The dipoles may retain their alignment (e.g., polarization state) after the electric field is removed, and different logic states (e.g., 0 and 1) may be stored as the different polarization states of the ferroelectric material 128. Accordingly, memory cell 108 may be programmed by charging cell plate 124 and cell bottom 126, which may apply an electric field across ferroelectric material 128 and place the ferroelectric material in a particular polarization state (e.g., depending on the polarity of the applied field) that may correspond to a particular data (e.g., logic) state. The data state of the memory cell may subsequently be determined (e.g., sensed) by determining which polarization state the ferroelectric material is in, as will be further described herein.

Figure 2:
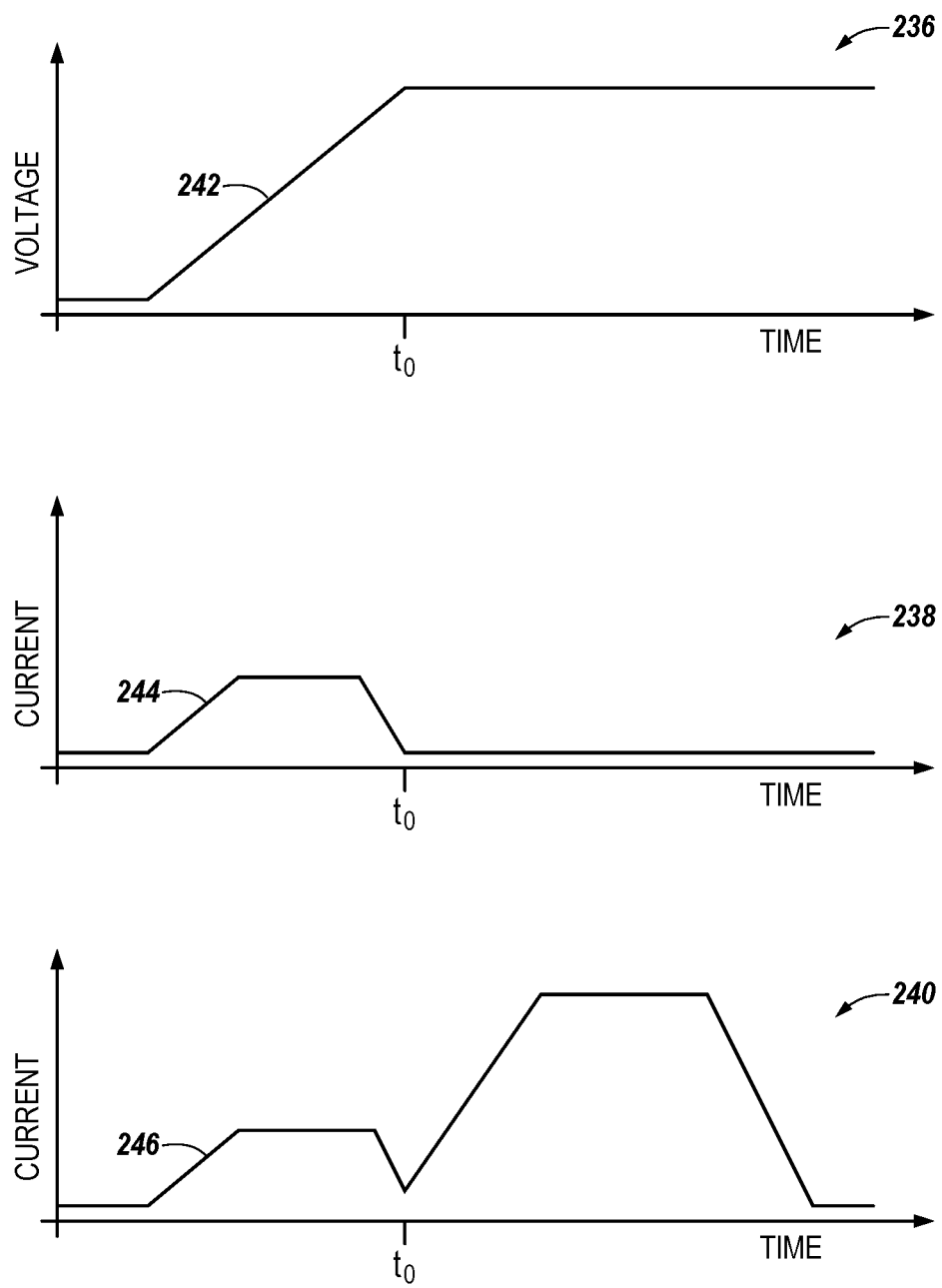
FIG. 2 illustrates examples of timing diagrams associated with sensing a memory cell in accordance with an embodiment of the present disclosure.

FIG. 2 illustrates examples of timing diagrams 236, 238, and 240 associated with sensing (e.g., determining the data state of) a memory cell in accordance with an embodiment of the present disclosure. The memory cell can be, for example, a ferroelectric memory (e.g., FeRAM) cell, such as, for instance, memory cell 108 previously described in connection with FIGS. 1A-1B.

Timing diagram 236 illustrates a waveform 242 that represents a sensing voltage signal (e.g. pulse) applied to the memory cell during a sense operation being performed on the memory cell. For example, the memory cell (e.g., the data line to which the cell is coupled) may be biased by the sensing voltage during the sense operation. The sensing voltage may be applied to the memory cell as a single pulse. For instance, as shown in FIG. 2, the amount of voltage being applied to the memory cell may be increased (e.g., ramped up) until time $t_0$, after which the voltage remains level for the remainder of the sense operation.

Timing diagrams 238 and 240 illustrate example waveforms 244 and 246, respectively, that represent the current signal (e.g., pulse) that may flow through, and be output by, the memory cell in response to the sensing voltage being applied to the cell, depending on the data state to which the memory cell has been programmed. For instance, the current signal output by the memory cell may be represented by waveform 244 if the memory cell has been programmed to a first data state (e.g., 0) corresponding to a first polarization state of the ferroelectric material of the memory cell, and the current signal output by the memory cell may be represented by waveform 246 if the memory cell has been programmed to a second data state (e.g., 1) corresponding to a second polarization state of the ferroelectric material of the memory cell. As used herein, the first polarization state may be referred to as a displacement state, and may correspond to a polarization state in which the alignment of the dipoles of the ferroelectric material of the memory cell do not change in response to the sensing voltage being applied to the cell. The second polarization state may be referred to as a polar state, and may correspond to a polarization state in which the alignment of the dipoles of the ferroelectric material of the memory cell changes (e.g., switch and/or flip) in response to the sensing voltage being applied to the cell.

In an example, the amount of current output by the memory cell in response to the sensing voltage being applied to the cell may correspond to the amount of charge discharged by the memory cell (e.g. by the capacitor of the memory cell) while the sensing voltage is being applied to the memory cell. As such, waveform 244 may correspond to the amount of charge discharged by the memory cell if the memory cell has been programmed to the first data state, and waveform 246 may correspond to the amount of charge discharged by the memory cell if the memory cell has been programmed to the second data state.

As such, the data state of the memory cell can be determined based, at least in part, on a comparison of the amount of charge discharged by the memory cell while the sensing voltage represented by waveform 242 is being applied to the memory cell before time $t_0$, and the amount of charge discharged by the memory cell while the sensing voltage is being applied to the cell after time $t_0$. For example, as illustrated in FIG. 2, the memory cell will discharge the same amount of charge before time $t_0$ regardless of whether the cell has been programmed to the first (e.g., displacement) or second (e.g., polar) data state, but the memory cell will also discharge an additional (e.g., greater) amount of charge after time $t_0$ only if the cell has been programmed to the second data state. As such, if the comparison indicates the amount of charge discharged by the memory cell before to is greater than the amount of charge discharged by the memory cell after to, as represented by waveform 244, then the memory cell has been programmed to the first data state; if the comparison indicates the amount of charge discharged by the memory cell before to is less than the amount of charge discharged by the memory cell after to, as represented by waveform 246, then the memory cell has been programmed to the second data state.

As illustrated in FIG. 2, time $t_0$ can correspond to the time at which a change of the polarization state (e.g., a switching of the alignment of the dipoles) of the ferroelectric material of the memory cell will occur while the sensing voltage is being applied to the memory cell if the cell has been programmed to the second data state. For instance, time $t_0$ can occur after the memory cell will have discharged half of its charge if the cell has been programmed to the first data state, and before the memory cell will have discharged half of its charge if the cell has been programmed to the second data state, as illustrated in FIG. 2.

The amount of charge discharged by the memory cell while the sensing voltage is being applied to the memory cell before time $t_0$ can be determined using a first capacitor, and the amount of charge discharged by the memory cell while the sensing voltage is being applied to the memory cell after time $t_0$ can be determined using a second (e.g., different) capacitor. For example, the first capacitor can store the amount of charge discharged by the cell before time $t_0$ and the second capacitor can store the amount of charge discharged by the cell after time to, and these respective stored charge amounts can be compared to determine the data state of the cell, as will be further described herein (e.g., in connection with FIGS. 3-4). Further, the comparison of the amounts of charge discharged by the memory cell before and after time $t_0$ can include a comparison of signals associated with the amounts of charge discharged by the cell before and after time $t_0$, as will be further described herein (e.g., in connection with FIGS. 3-4).

Figure 3:
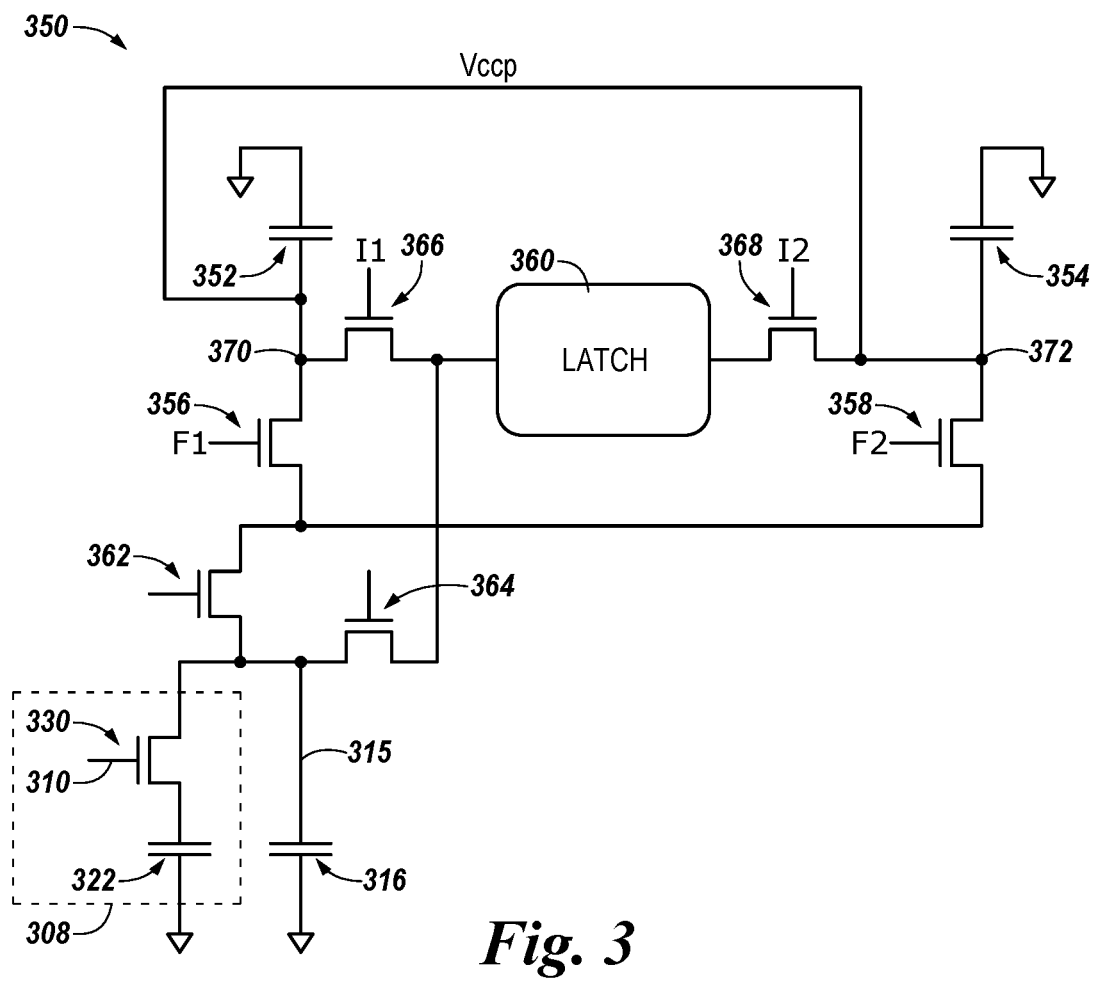
FIG. 3 illustrates an example of circuitry for charge separation for memory sensing in accordance with an embodiment of the present disclosure.

FIG. 3 illustrates an example of circuitry (e.g., sense circuitry) 350 for charge separation for memory sensing in accordance with an embodiment of the present disclosure. Circuitry 350 can be coupled to, and be included in the same apparatus (e.g., memory device) as, memory array 106 previously described in connection with FIGS. 1A-1B.

For example, as illustrated in FIG. 3, circuitry 350 can be coupled to an array that includes memory cells 308 that are analogous to memory cells 108 previously described in connection with FIGS. 1A-1B. For instance, as illustrated in FIG. 3, memory cell 308 can include a storage element (e.g., capacitor) 322, and a select device 330 coupled to an access line 310 and data (e.g., digit) line 315, in a manner analogous to that previously described in connection with FIGS. 1A-1B. Although a single memory cell 308 is shown in FIG. 3 for simplicity and so as not to obscure embodiments of the present disclosure, circuitry 350 can be coupled to each respective memory cell of the array.

Further, although not shown in FIG. 3 for simplicity and so as not to obscure embodiments of the present disclosure, circuitry 350 and/or the memory array that includes cells 308 can be coupled to a controller. The controller can include, for example, control circuitry and/or logic (e.g., hardware and/or firmware), and can be included on the same physical device (e.g., the same die) as the memory array, or can be included on a separate physical device that is communicatively coupled to the physical device that includes the memory array. In an embodiment, components of the controller can be spread across multiple physical devices (e.g., some components on the same die as the array, and some components on a different die, module, or board). The controller can operate circuitry 350 to utilize charge separation as described herein to determine the data state of memory cell 308.

For example, as shown in FIG. 3, circuitry 350 can include a first capacitor 352 and a second capacitor 354. Capacitor 352 can store charge discharged by memory cell 308 (e.g., by storage element 322) while a sensing voltage is being applied to memory cell 308 (e.g., via data line 315) before a particular reference time, and capacitor 354 can store charge discharged by memory cell 308 while the sensing voltage is being applied to memory cell 308 after the particular reference time. The sensing voltage can be, for example, the sensing voltage represented by waveform 242 previously described in connection with FIG. 2, and the particular reference time can be, for example, time $t_0$ previously described in connection with FIG. 2.

For instance, as shown in FIG. 3, circuitry 350 can include a first transistor 356 coupled to first capacitor 352, and a second transistor 358 coupled to second capacitor 354. Further, circuitry 350 can include a cascode 362 coupled to transistors 356 and 358 and memory cell 308, as illustrated in FIG. 3. Transistors 356 and 358 can be, for example, metal-oxide-semiconductor field-effect transistors (MOSFETs), and cascode 362 can be, for example, an n-channel MOSFET (nMOS FET).

Transistor 356 can couple capacitor 352 to memory cell 308 (e.g., via data line 315) through cascode 362 upon a first signal (e.g., F1 illustrated in FIG. 3) being applied to transistor 356, and transistor 358 can couple capacitor 354 to memory cell 308 (e.g., via data line 315) through cascode 362 upon a second signal (e.g., F2 illustrated in FIG. 3) being applied to transistor 358. Further, cascode 362 can be used to bias memory cell 308 (e.g., data line 315) at the sensing voltage.

As an example, the first signal can be applied to transistor 356 before the particular reference time (e.g., t0) such that only capacitor 352 is coupled to memory cell 308 before the particular reference time, and the second signal can be applied to transistor 358 after the particular reference time such that only capacitor 354 is coupled to memory cell 308 after the particular reference time (e.g., capacitor 354 is not coupled to memory cell 308 before the particular reference time, and capacitor 352 is not coupled to memory cell 308 after the particular reference time). Accordingly, in such an example, the charge discharged by memory cell 308 while the sensing voltage is being applied thereto before the particular reference time may be discharged to, and stored by (e.g. integrated on), capacitor 352, and the charge discharged by memory cell 308 while the sensing voltage is being applied thereto after the particular reference time may be discharged to, and stored by (e.g., integrated on), capacitor 354. If memory cell 308 has been programmed to the first (e.g., displacement) data state, capacitor 352 will store the majority (e.g., the highest percentage) of the charge discharged by memory cell 308; if memory cell 308 has been programmed to the second (e.g., polar) data state, capacitor 354 will store the majority of the charge discharged by memory cell 308.

Accordingly, the data state to which memory cell 308 has been programmed can be determined based, at least in part, on a comparison of the amount of charge stored by capacitors 352 and 354 after the sensing voltage has been applied to memory cell 308 and signals F1 and F2 have been applied to transistors 356 and 358, respectively. For example, if the comparison indicates the amount of charge stored by capacitor 352 is greater than the amount of charge stored by capacitor 354, then the memory cell has been programmed to the first data state; if the comparison indicates the amount of charge stored by capacitor 352 is less than the amount of charge stored by capacitor 354, then the memory cell has been programmed to the second data state.

The comparison of the amount of charge stored by capacitors 352 and 354 can be performed, for example, using latch 360 of circuitry 350. For instance, capacitors 352 and 354 will have a voltage across, at nodes 370 and 372, respectively, that corresponds to the amount of charge stored by capacitors 352 and 354, and which can be read by latch 360. As shown in FIG. 3, latch 360 can be coupled to capacitor 352 through transistor 366, latch 360 can be coupled to capacitor 354 through transistor 368, and latch 360 can be disconnected from data line 315 by transistor 364. When signals (e.g., I1 and I2 illustrated in FIG. 3) are applied to transistors 366 and 368, respectively, the signals at nodes 370 and 372, which correspond to the amount of charge stored by capacitors 352 and 354, respectively, can be compared by latch 360 to determine the data state of memory cell 308. Examples of the signals at nodes 370 and 372, and the comparison of the signals, will be further described herein (e.g., in connection with FIG. 4).

As such, the data state of memory cell 308 can be determined without using an external reference voltage. For instance, the data state of memory cell 308 can be determined using a self-reference sensing approach. Further, the data state of memory cell 308 can be determined using a single pulse, rather than multiple sensing pulses.

In an example, data line 315 and capacitors 352 and 354 may be pre-charged before the sensing voltage is applied to memory cell 308. For instance, in the example illustrated in FIG. 3, data line 315 and capacitors 352 and 354 may be pre-charged to an initial voltage Vccp. Capacitor 316 illustrated in FIG. 3 may represent the capacitance of data line 315 once data line 315 has been pre-charged.

Further, the amount by (e.g., value to) which data line 315 and capacitors 352 and 354 are pre-charged may vary. Varying the pre-charge amount can shift the portion of the current signal distribution output by memory cell 308 corresponding to the additional charge discharged by the memory cell after time $t_0$ if the cell has been programmed to the second data state (e.g., the portion of the current signal distribution corresponding to the polar state), which can further separate this portion of the current signal distribution from the portion corresponding to the charge discharged before time $t_0$ (e.g., the portion of the current signal corresponding to the displacement state). For instance, varying the pre-charge amount can shift the polar state portion of the current signal distribution such that it is completely separate from the displacement state portion.

Figure 4:
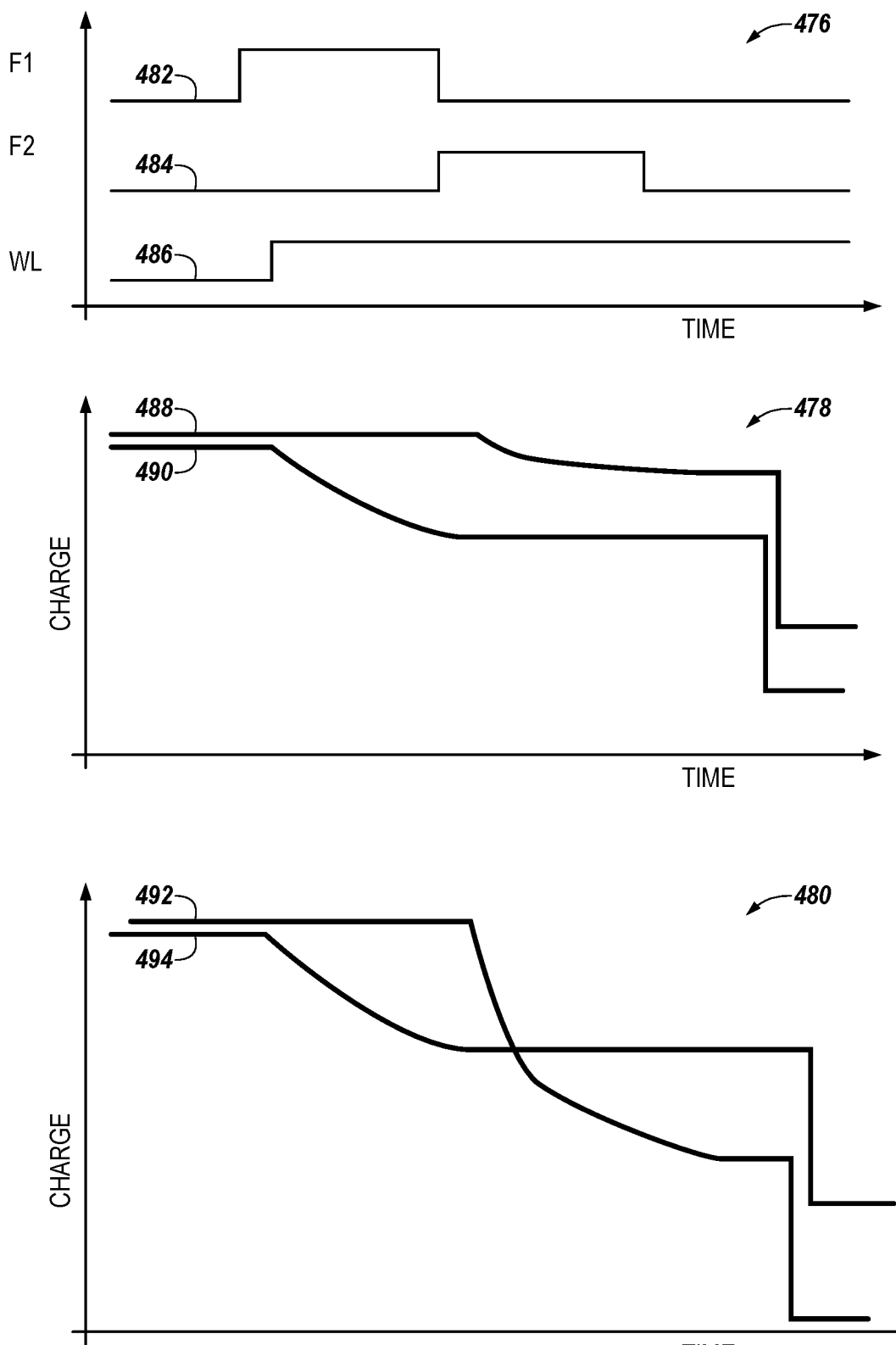
FIG. 4 illustrates examples of timing diagrams associated with sensing a memory cell in accordance with an embodiment of the present disclosure.

FIG. 4 illustrates examples of timing diagrams 476, 478, and 480 associated with sensing a memory cell in accordance with an embodiment of the present disclosure. The memory cell can be, for example, memory cell 308 previously described in connection with FIG. 3.

Timing diagram 476 illustrates example waveforms 482, 484, and 486 that represent signals associated with (e.g. used during) a sense operation being performed on the memory cell. For example, waveform 482 represents signal F1 applied to transistor 356 previously described in connection with FIG. 3, waveform 484 represents signal F2 applied to transistor 358 previously described in connection with FIG. 3, and waveform 486 represents a signal used to activate access line 310 previously described in connection with FIG. 3.

Figure 5:
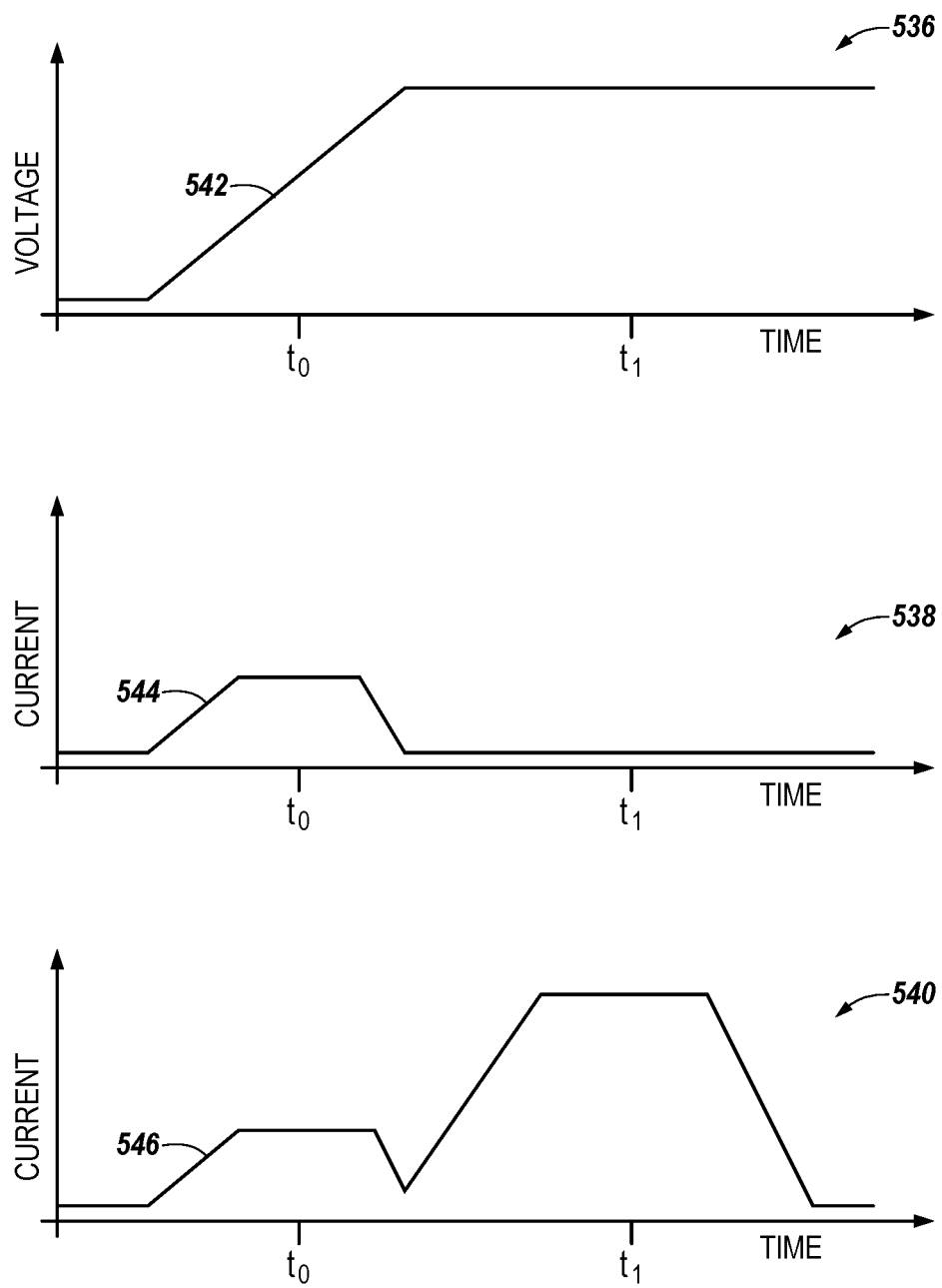
FIG. 5 illustrates examples of timing diagrams associated with sensing a memory cell in accordance with an embodiment of the present disclosure.

During the sense operation, signal F1 is switched on (e.g., high) first, as illustrated in FIG. 4, such that charge discharged by the memory cell is discharged to capacitor 352, as previously described in connection with FIG. 3. After signal F1 is switched on, access line 310 can be activated, as illustrated in FIG. 4. After access line 310 has been activated, signal F1 is switched off (e.g., low) and signal F2 is switched on, as illustrated in FIG. 5, such that charge discharged by the memory cell is discharged to capacitor 354 (e.g., instead of to capacitor 352), as previously described in connection with FIG. 3. Although not shown in FIG. 4, the time at which signal F1 is switched off and signal F2 is switched on can correspond to reference time $t_0$ previously described herein. Signal F2 can then subsequently be switched off (e.g., at the conclusion of the sense operation).

Timing diagram 478 illustrates example waveforms 488 and 490 that represent the signals at circuit nodes 372 and 370, respectively, previously described in connection with FIG. 3, during the sense operation performed on the memory cell if the memory cell has been programmed to the second (e.g., polar) data state. Timing diagram 480 illustrates example waveforms 492 and 494 that represent the signals at circuit nodes 372 and 370, respectively, during the sense operation if the memory cell has been programmed to the first (e.g., displacement) data state. The signals at nodes 372 and 370 can correspond to the amount of charge stored by capacitors 354 and 352, respectively, as previously described in connection with FIG. 3.

As shown in FIG. 4, at the conclusion of the sense operation (e.g., after signal F2 has been switched off), signal 490 is lower than signal 488, and signal 494 is higher than signal 492. As such, a comparison between signals 490 and 488 at the conclusion of the sense operation may indicate that the amount of charge stored by capacitor 352 is less than the amount of charge stored by capacitor 354, and therefore the memory cell has been programmed to the second (e.g., polar) data state, as previously described herein; a comparison between signals 494 and 492 at the conclusion of the sense operation may indicate that the amount of charge stored by capacitor 352 is greater than the amount of charge stored by capacitor 354, and therefore the memory cell has been programmed to the first (e.g., displacement) data state, as previously described herein. The comparison between the signals can be performed, for example, by latch 360, as previously described in connection with FIG. 3.

FIG. 5 illustrates examples of timing diagrams 536, 538, and 540 associated with sensing (e.g., determining the data state of) a memory cell in accordance with an embodiment of the present disclosure. The memory cell can be, for example, a ferroelectric memory (e.g., FeRAM) cell, such as, for instance, memory cell 108 previously described in connection with FIGS. 1A-1B and/or memory cell 308 previously described in connection with FIG. 3.

Timing diagram 536 illustrates a waveform 542 that represents a sensing voltage signal (e.g. pulse) applied to the memory cell during a sense operation being performed on the memory cell, in a manner analogous to waveform 242 previously described in connection with FIG. 2. Timing diagrams 538 and 540 illustrate example waveforms 544 and 546, respectively, that represent the current signal (e.g., pulse) that may flow through, and be output by, the memory cell in response to the sensing voltage being applied to the cell, depending on the data state to which the memory cell has been programmed, in a manner analogous to waveforms 244 and 246 previously described in connection with FIG. 2. For instance, the current signal output by the memory cell may be represented by waveform 544 if the memory cell has been programmed to a first (e.g., displacement) data state, and the current signal output by the memory cell may be represented by waveform 546 if the memory cell has been programmed to a second (e.g., polar) data state, in a manner analogous to that previously described in connection with FIG. 2. Further, waveform 544 may correspond to the amount of charge discharged by the memory cell if the memory cell has been programmed to the first data state, and waveform 546 may correspond to the amount of charge discharged by the memory cell if the memory cell has been programmed to the second data state, in a manner analogous to that previously described in connection with FIG. 2.

As such, the data state of the memory cell can be determined based, at least in part, on a comparison of the amount of charge discharged by the memory cell while the sensing voltage represented by waveform 542 is being applied to the memory cell before time $t_0$ illustrated in FIG. 5, and the amount of charge discharged by the memory cell while the sensing voltage is being applied to the cell after time $t_1$ illustrated in FIG. 5. For example, as illustrated in FIG. 5, the memory cell will discharge the same amount of charge before time $t_0$ regardless of whether the cell has been programmed to the first (e.g., displacement) or second (e.g., polar) data state, but the memory cell will also discharge an additional (e.g., greater) amount of charge after time $t_1$ only if the cell has been programmed to the second data state. As such, if the comparison indicates the amount of charge discharged by the memory cell before time $t_0$ is greater than the amount of charge discharged by the memory cell after time $t_1$, as represented by waveform 544, then the memory cell has been programmed to the first data state; if the comparison indicates the amount of charge discharged by the memory cell before to is less than the amount of charge discharged by the memory cell after $t_1$, as represented by waveform 546, then the memory cell has been programmed to the second data state.

As illustrated in FIG. 5, time $t_0$ can correspond to a time before a change of the polarization state (e.g., a switching of the alignment of the dipoles) of the ferroelectric material of the memory cell will occur while the sensing voltage is being applied to the memory cell if the cell has been programmed to the second data state, and time $t_1$ can correspond to a time after the change of the polarization state of the ferroelectric material of the cell will occur if the cell has been programmed to the second data state. For instance, time $t_0$ can correspond to the time at which the memory cell will have discharged half of its charge if the cell has been programmed to the first (e.g., displacement) data state, and time $t_1$ can correspond to the time at which the memory cell will have discharged half of its charge if the cell has been programmed to the second (e.g., polar) data state, as illustrated in FIG. 5. The amount of time between $t_0$ and $t_1$ illustrated in FIG. 5 can be, for instance, 5-10 nanoseconds.

The amount of charge discharged by the memory cell while the sensing voltage is being applied to the memory cell before time $t_0$ can be determined using capacitor 352 of circuitry 350 previously described in connection with FIG. 3, and the amount of charge discharged by the memory cell while the sensing voltage is being applied to the memory cell after time $t_1$ can be determined using capacitor 354 of circuitry 350 previously described in connection with FIG. 3. For example, capacitor 352 can store the amount of charge discharged by the cell before time $t_0$ and capacitor 354 can store the amount of charge discharged by the cell after time $t_1$, and these respective stored charge amounts can be compared to determine the data state of the cell, in a manner analogous to that previously described in connection with FIGS. 3-4. For instance, the comparison of the amounts of charge discharged by the memory cell before time $t_0$ and after time $t_1$ can include a comparison (e.g., by latch 360) of signals associated with the amounts of charge discharged by the cell before time $t_0$ and after time $t_1$, in a manner analogous to that previously described in connection with FIGS. 3-4.

As such, the data state of the memory cell can be determined without using an external reference voltage. For instance, the data state of the memory cell can be determined using a self-reference sensing approach. Further, the data state of the memory cell can be determined using a single pulse, rather than multiple sensing pulses.

Figure 6:
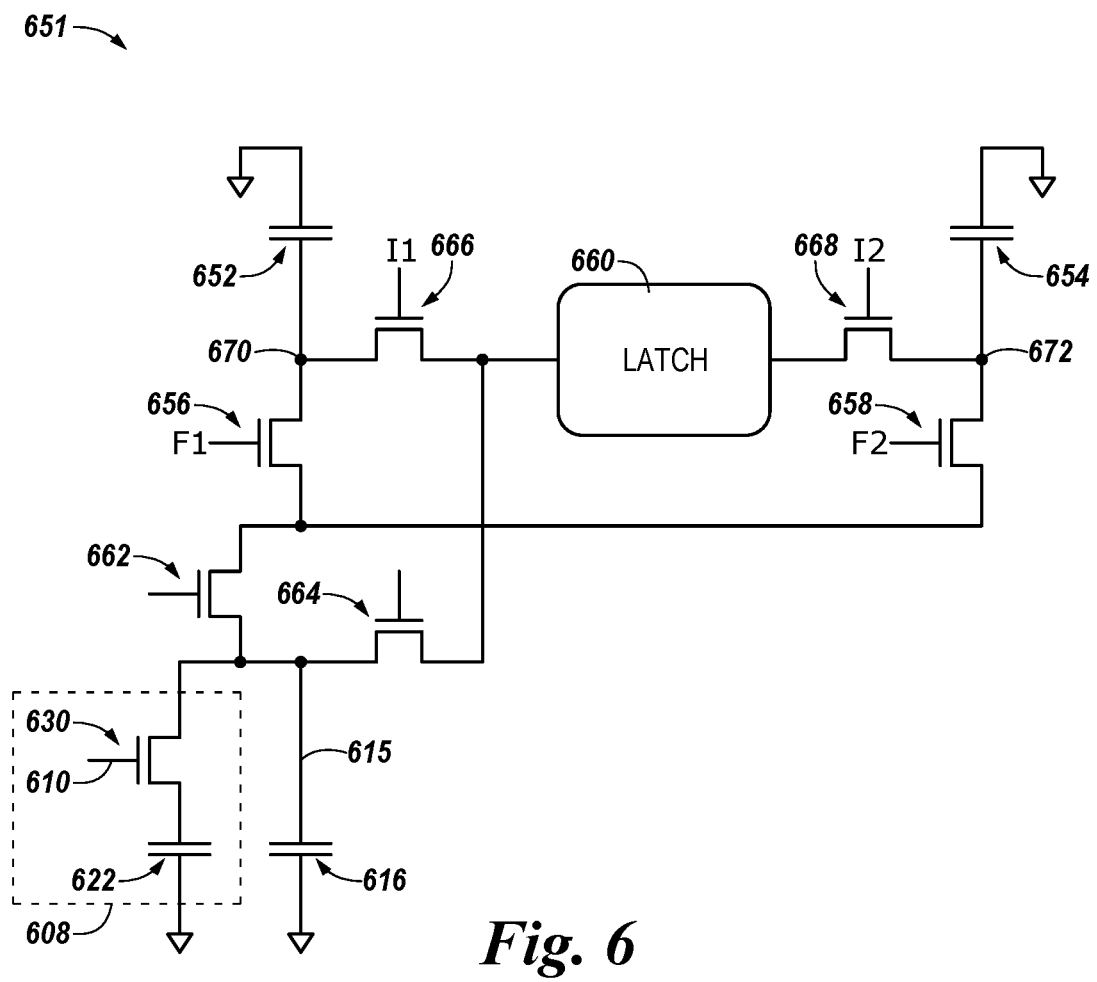
FIG. 6 illustrates an example of circuitry for charge separation for memory sensing in accordance with an embodiment of the present disclosure.

FIG. 6 illustrates an example of circuitry (e.g., sense circuitry) 651 for charge separation for memory sensing in accordance with an embodiment of the present disclosure. Circuitry 651 can be coupled to, and be included in the same apparatus (e.g., memory device) as, memory array 106 previously described in connection with FIGS. 1A-1B, in a manner analogous to circuitry 350 previously described in connection with FIG. 3. For example, as illustrated in FIG. 6, circuitry 651 can be coupled to an array that includes memory cells 608 that are analogous to memory cells 108 previously described in connection with FIGS. 1A-1B (e.g., that include a storage element 622, and a select device 630 coupled to an access line 610 and data line 615, in a manner analogous to that previously described in connection with FIGS. 1A-1B).

Further, as shown in FIG. 6, circuitry 651 can include a first capacitor 652 and a second capacitor 654. In the example illustrated in FIG. 6, capacitor 652 can store charge discharged by memory cell 608 (e.g., by storage element 622) while a first sensing voltage is being applied to memory cell 608 (e.g., via data line 615), and capacitor 654 can store charge discharged by memory cell 608 while a second (e.g., different) sensing voltage is being applied to memory cell 308 after the first sensing voltage has been applied to the cell (e.g., the first and second sensing voltages are applied to the cell separately). The first sensing voltage can be a voltage that is less than a particular voltage, and the second sensing voltage can be a voltage that is greater than the particular voltage. For example, the first and second sensing voltages can be less and greater than, respectively, a voltage that will cause a change of the polarization state (e.g., a switching of the alignment of the dipoles) of the ferroelectric material of memory cell 608 to occur while that voltage is being applied to memory cell 608 if the cell has been programmed to the second (e.g., polar) data state. This voltage may be referred to herein as the coercitive voltage, and may be, for instance, 0.7 Volts in some examples.

The first and second sensing voltages can be applied to memory cell 608 during the same (e.g., as part of a single) sense operation being performed on memory cell 608. Further, the first and second sensing voltages can have a lower magnitude than the sensing voltages represented by waveforms 242 and 542 previously described in connection with FIGS. 2 and 5, respectively, which can further reduce the amount of power used to sense memory cell 608, and/or can further separate the portion of the current signal distribution output by memory cell 608 corresponding to the polar state from the portion of the current signal distribution output by memory cell 608 corresponding to the displacement state. Further, the first sensing voltage may have a greater magnitude than the difference between the two sensing voltages.

As shown in FIG. 6, circuitry 651 can include a first transistor 656 coupled to first capacitor 652, a second transistor 658 coupled to second capacitor 654, and a cascode 662 coupled to transistors 656 and 658 and memory cell 608, in a manner analogous to that previously described in connection with FIG. 3. Transistor 656 can couple capacitor 652 to memory cell 608 through cascode 662 upon signal F1 being applied to transistor 656, and transistor 658 can couple capacitor 654 to memory cell 608 through cascode 662 upon signal F2 being applied to transistor 658, in a manner analogous to that previously described in connection with FIG. 3. Further, cascode 662 can be used to bias memory cell 608 (e.g., data line 615) at the first and second sensing voltages.

As an example, signal F1 can be applied to transistor 656 while the first sensing voltage is being applied to memory cell 608 such that only capacitor 652 is coupled to memory cell 608 while the first sensing voltage is being applied thereto, and signal F2 can be applied to transistor 658 while the second sensing voltage is being applied to memory cell 608 such that only capacitor 654 is coupled to memory cell 608 while the second sensing voltage is being applied thereto (e.g., capacitor 654 is not coupled to memory cell 308 while the first sensing voltage is being applied, and capacitor 652 is not coupled to memory cell 608 while the second sensing voltage is being applied). Accordingly, in such an example, the charge discharged by memory cell 608 while the first sensing voltage is being applied thereto may be discharged to, and stored by (e.g. integrated on), capacitor 652, and the charge discharged by memory cell 608 while the second sensing voltage is being applied thereto may be discharged to, and stored by (e.g., integrated on), capacitor 654. If memory cell 608 has been programmed to the first (e.g., displacement) data state, capacitor 652 will store the majority (e.g., the highest percentage) of the charge discharged by memory cell 608; if memory cell 608 has been programmed to the second (e.g., polar) data state, capacitor 654 will store the majority of the charge discharged by memory cell 608.

Accordingly, the data state to which memory cell 608 has been programmed can be determined based, at least in part, on a comparison of the amount of charge stored by capacitors 652 and 654 after the first and second sensing voltages have been applied to memory cell 608 (e.g., after signals F1 and F2 have been applied to transistors 656 and 658, respectively). For example, if the comparison indicates the amount of charge stored by capacitor 652 is greater than the amount of charge stored by capacitor 654 (e.g., indicating memory cell 608 discharged more charge while the first sensing voltage was being applied than while the second sensing voltage was being applied), then the memory cell has been programmed to the first data state; if the comparison indicates the amount of charge stored by capacitor 652 is less than the amount of charge stored by capacitor 654 (e.g., indicating memory cell 608 discharged less charge while the first sensing voltage was being applied than while the second sensing voltage was being applied), then the memory cell has been programmed to the second data state.

The comparison of the amount of charge stored by capacitors 652 and 654 can be performed, for example, using latch 660 of circuitry 651, in a manner analogous to that previously described in connection with FIG. 3. For instance, when signals I1 and I2 are applied to transistors 666 and 668, respectively, the signals at nodes 670 and 672, which correspond to the amount of charge stored by capacitors 652 and 654, respectively, can be compared by latch 660 to determine the data state of memory cell 608, in a manner analogous to that previously described in connection with FIG. 3. Examples of the signals at nodes 670 and 672, and the comparison of the signals, will be further described herein (e.g., in connection with FIG. 7).

As such, the data state of memory cell 608 can be determined without using an external reference voltage. For instance, the data state of memory cell 608 can be determined using a self-reference sensing approach.

Figure 7:
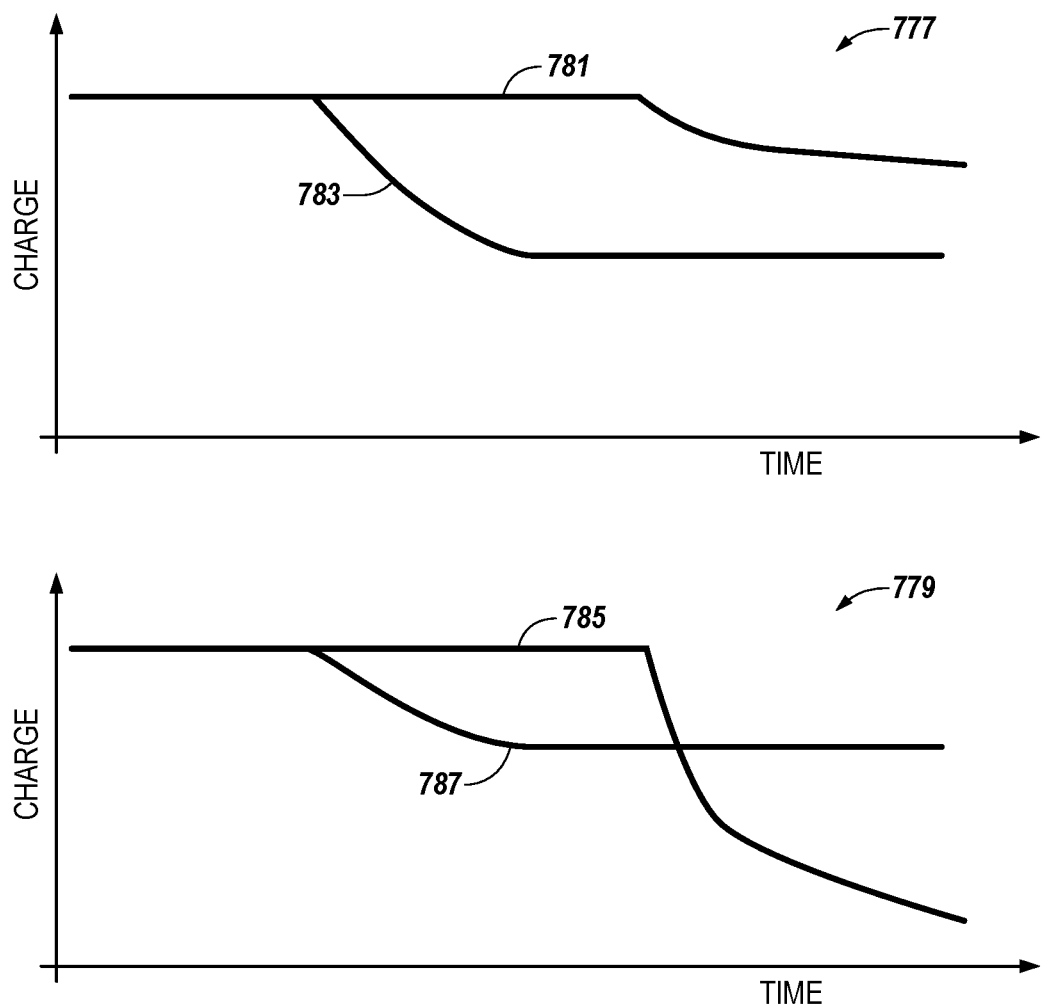
FIG. 7 illustrates examples of timing diagrams associated with sensing a memory cell in accordance with an embodiment of the present disclosure.

FIG. 7 illustrates examples of timing diagrams 777 and 779 associated with sensing a memory cell in accordance with an embodiment of the present disclosure. The memory cell can be, for example, memory cell 608 previously described in connection with FIG. 6.

Timing diagram 777 illustrates example waveforms 781 and 783 that represent the signals at circuit nodes 672 and 670, respectively, previously described in connection with FIG. 6, during the sense operation performed on the memory cell if the memory cell has been programmed to the second (e.g., polar) data state. Timing diagram 779 illustrates example waveforms 785 and 787 that represent the signals at circuit nodes 672 and 670, respectively, during the sense operation if the memory cell has been programmed to the first (e.g., displacement) data state. The signals at nodes 672 and 670 can correspond to the amount of charge stored by capacitors 654 and 652, respectively, as previously described in connection with FIG. 6.

As shown in FIG. 7, at the conclusion of the sense operation (e.g., after both the first and second sensing voltages have been applied to the memory cell), signal 783 is lower than signal 781, and signal 787 is higher than signal 785. As such, a comparison between signals 783 and 781 at the conclusion of the sense operation may indicate that the amount of charge stored by capacitor 652 is less than the amount of charge stored by capacitor 654, and therefore the memory cell has been programmed to the second (e.g., polar) data state, as previously described herein; a comparison between signals 787 and 785 at the conclusion of the sense operation may indicate that the amount of charge stored by capacitor 652 is greater than the amount of charge stored by capacitor 654, and therefore the memory cell has been programmed to the first (e.g., displacement) data state, as previously described herein. The comparison between the signals can be performed, for example, by latch 660, as previously described in connection with FIG. 6.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising: a memory cell;
a first capacitor and a second capacitor;
a first transistor configured to couple the first capacitor to the memory cell upon a first signal being applied to the first transistor, wherein the first signal is applied to the first transistor before a particular reference time such that the first capacitor is coupled to the memory cell before the particular reference time; and
a second transistor configured to couple the second capacitor to the memory cell upon a second signal being applied to the second transistor, wherein:
the second signal is applied to the second transistor after the particular reference time such that the second capacitor is coupled to the memory cell after the particular reference time; and
the particular reference time corresponds to a time at which a change of a polarization state of a ferroelectric material of the memory cell will occur while a sensing voltage is being applied to the memory cell when the memory cell is in a particular data state.

2. The apparatus of claim 1, wherein the particular reference time is a time that occurs after a reference time while the sensing voltage is being applied to the memory cell, wherein the reference time corresponds to a time at which the memory cell will have discharged half of its charge when the memory cell is in a particular data state.

3. The apparatus of claim 1, wherein the particular reference time is a time that occurs after a first reference time while the sensing voltage is being applied to the memory cell and before a second reference time that is subsequent to the first reference time while the sensing voltage is being applied to the memory cell, wherein the second reference time corresponds to a time at which the memory cell will have discharged half of its charge when the memory cell is in a particular data state.

4. The apparatus of claim 1, wherein:
the first capacitor is configured to store a charge discharged by the memory cell while the sensing voltage is being applied to the memory cell before the particular reference time; and
the second capacitor is configured to store a charge discharged by the memory cell while the sensing voltage is being applied to the memory cell after the particular reference time.

5. The apparatus of claim 1, wherein the apparatus includes circuitry configured to determine a data state of the memory cell based, at least in part, on a comparison of charge stored by the first capacitor and charge stored by the second capacitor.

6. The apparatus of claim 5, wherein the circuitry includes a latch configured to perform the comparison of the charge stored by the first capacitor and the charge stored by the second capacitor.

7. The apparatus of claim 5, wherein:
the data state of the memory cell is a first data state when the comparison indicates the charge stored by the first capacitor is greater than the charge stored by the second capacitor; and
the data state of the memory cell is a second data state when the comparison indicates the charge stored by the first capacitor is less than the charge stored by the second capacitor.

8. The apparatus of claim 5, wherein the comparison indicates whether the amount of charge discharged by the memory cell before the particular reference time is greater than the amount of charge discharged by the memory cell after the particular reference time.

9. A method of operating memory, comprising:
determining a data state of a memory cell based, at least in part, on a comparison of:
an amount of charge discharged by the memory cell while a first sensing voltage is being applied to the memory cell, wherein the first sensing voltage is less than a particular voltage; and
an amount of charge discharged by the memory cell while a second sensing voltage is being applied to the memory cell, wherein the second sensing voltage is greater than the particular voltage;
wherein:
the memory cell is determined to be in a first data state when the amount of charge discharged by the memory cell while the first sensing voltage being applied to the memory cell is greater than the amount of charge discharged by the memory cell while the second sensing voltage is being applied to the memory cell;

the memory cell is determined to be in a second data state when the amount of charge discharged by the memory cell while the first sensing voltage is being applied to the memory cell is less than the amount of charge discharged by the memory cell while the second sensing voltage is being applied to the memory cell; and the particular voltage is a voltage that will cause a change of a polarization state of a ferroelectric material of the memory cell to occur while the voltage is being applied to the memory cell when the memory cell is in the second data state.

10. The method of claim 9, wherein the method includes applying the first sensing voltage to the memory cell and applying the second sensing voltage to the memory cell during a same sense operation being performed on the memory cell.

11. The method of claim 9, further comprising determining the data state of the memory cell based, at least in part, on a comparison of an amount of charge discharged by the memory cell at a first reference time and an amount of charge discharged by the memory cell at a second reference time.

12. The method of claim 11, wherein:
the memory cell is in the first data state upon the comparison indicating the memory cell has discharged half of its charge at the first reference time; and
the memory cell is in the second data state upon the comparison indicating the memory cell has discharged half of its charge at the second reference time.

13. The method of claim 9, further comprising determining the data state of the memory cell based, at least in part, on a comparison of an amount of charge discharged by the memory cell while a sensing voltage is being applied to the memory cell before a first reference time and an amount of charge discharged by the memory cell while a sensing voltage is being applied to the memory cell after a second reference time.

14. The method of claim 13, wherein the memory cell is in the first data state when the memory cell has discharged a greater amount of the charge before the first reference time than after the second reference time.

15. The method of claim 13, wherein the memory cell is in the second data state when the memory cell has discharged a greater amount of the charge after the second reference time than before the first reference time.

16. An apparatus, comprising:
a memory cell;
a cascode coupled to the memory cell, wherein:
the cascode is a field-effect transistor; and
the cascode is configured to bias the memory cell at a sensing voltage;
a first capacitor and a second capacitor;
a first transistor coupled to the cascode and configured to couple the first capacitor to the memory cell through the cascode upon a first signal being applied to the first transistor; and
a second transistor coupled to the cascode and configured to couple the second capacitor to the memory cell through the cascode upon a second signal being applied to the second transistor.

17. The apparatus of claim 16, wherein the first signal is applied to the first transistor while the sensing voltage is being applied to the memory cell such that the first capacitor is coupled to the memory cell while the sensing voltage is being applied to the memory cell.

18. The apparatus of claim 16, wherein the second signal is applied to the second transistor while the sensing voltage is being applied to the memory cell such that the second capacitor is coupled to the memory cell while the sensing voltage is being applied to the memory cell.

* * * * *